US012733235B2

(12) United States Patent
Shiraishi et al.

(10) Patent No.: US 12,733,235 B2
(45) Date of Patent: Sep. 8, 2026

(54) SEMICONDUCTOR DEVICE AND POWER CONVERSION DEVICE

(71) Applicant: Hitachi Power Semiconductor Device, Ltd., Ibaraki (JP)

(72) Inventors: Masaki Shiraishi, Hitachi (JP); Daisuke Kawase, Hitachi (JP); Tetsuo Oda, Hitachi (JP); Tomoyasu Furukawa, Tokyo (JP); Yutaka Kato, Hitachi (JP); Tsubasa Moritsuka, Hitachi (JP)

(73) Assignee: MINEBEA POWER SEMICONDUCTOR DEVICE INC., Ibaraki (JP)

( * ) Notice: Subject to any disclaimer, the term of this patent is extended or adjusted under 35 U.S.C. 154(b) by 232 days.

(21) Appl. No.: 18/683,523

(22) PCT Filed: Nov. 11, 2022

(86) PCT No.: PCT/JP2022/042064

§ 371 (c)(1),
(2) Date: Feb. 14, 2024

(87) PCT Pub. No.: WO2023/112570

PCT Pub. Date: Jun. 22, 2023

(65) Prior Publication Data

US 2024/0355888 A1 Oct. 24, 2024

(30) Foreign Application Priority Data

Dec. 13, 2021 (JP) ................................ 2021-201431

(51) Int. Cl.

| | |
|---|---|
| ***H10D 64/00*** | (2025.01) |
| ***H02M 7/5387*** | (2007.01) |
| ***H10D 62/10*** | (2025.01) |

(52) U.S. Cl.

CPC ........ *H10D 64/111* (2025.01); *H02M 7/5387* (2013.01); *H10D 62/107* (2025.01)

(58) Field of Classification Search

CPC .. H10D 64/111; H10D 62/107; H02M 7/5387

(Continued)

(56) References Cited

U.S. PATENT DOCUMENTS

| | | | | |
|---|---|---|---|---|
| 6,198,126 B1 | 3/2001 | Mori et al. | | |
| 2008/0169526 A1* | 7/2008 | Wakimoto | ......... | H10D 30/0297 257/490 |

(Continued)

FOREIGN PATENT DOCUMENTS

| | | |
|---|---|---|
| CN | 113725279 | 11/2021 |
| JP | 2003-158258 A | 5/2003 |

(Continued)

OTHER PUBLICATIONS

International Search Report of PCT/JP2022/042064 dated Jan. 24, 2023.

(Continued)

*Primary Examiner* — Yemane Mehari

(74) *Attorney, Agent, or Firm* — MATTINGLY & MALUR, PC

(57) ABSTRACT

The present invention provides: a semiconductor device which has higher resistance to bias at high temperatures and high humidities than ever before, while achieving good connection between a field limiting layer and a field plate; and a power conversion device which uses this semiconductor device. A semiconductor device according to the present invention is characterized by comprising a floating field limiting layer that is provided in a termination region and a field plate that is electrically connected to the field limiting layer, and is also characterized in that: the field plate is formed of a polysilicon; the field plate and the field (Continued)

limiting layer are connected to each other via an Al electrode; and the connection between the field limiting layer and the Al electrode and the connection between the field plate and the Al electrode are established at different contacts.

3 Claims, 3 Drawing Sheets

(58) Field of Classification Search
USPC .......................................................... 363/98
See application file for complete search history.

(56) References Cited

U.S. PATENT DOCUMENTS

2011/0140165 A1* 6/2011 Kusunoki ............ H10D 12/481 257/E29.197
2011/0310643 A1* 12/2011 Yasuoka ............... H02M 7/487 363/37
2013/0214394 A1 8/2013 Senoo
2015/0054118 A1* 2/2015 Senoo .................. H10D 62/127 257/490
2015/0280546 A1* 10/2015 Kouno .................... H02M 1/36 363/132
2016/0013265 A1* 1/2016 Yilmaz ................ H10D 12/411 257/192
2016/0351657 A1 12/2016 Senoo
2019/0109230 A1* 4/2019 Uhnevionak ........ H10D 62/107
2021/0367028 A1 11/2021 Furukawa et al.

FOREIGN PATENT DOCUMENTS

JP 2016-119434 A 6/2016
WO 2013/140572 A1 9/2013

OTHER PUBLICATIONS

Taiwan Office Action received in corresponding Taiwan Application 111141347 dated Jan. 24, 2023.
Japanese Office Action received in corresponding Japanese Application No. 2021-201431 dated Sep. 9, 2025.
Extended European Search Report received in corresponding European Application No. 22907101.4 dated Oct. 28, 2025.

* cited by examiner

FIG. 2

SEMICONDUCTOR DEVICE AND POWER CONVERSION DEVICE

TECHNICAL FIELD

The present invention relates to a semiconductor device and a power conversion device.

BACKGROUND ART

Since power semiconductors are used in a variety of harsh environments, it is necessary to satisfy a large number of items for reliability assessment. One of the items for reliability assessment is a high temperature and high humidity bias resistance. The power semiconductor includes an active region for allowing currents to flow and a termination region for holding a withstand voltage. In order to maintain the withstand voltage, the termination region has a p-type field-limiting layer (in the case of an n-type structure) and a floating field plate (aluminum (Al) electrode) connected to the field-limiting layer.

In a conventional power semiconductor, by a voltage being applied between Al electrodes which are field plates in a state where moisture intrudes into the termination region in a high temperature and high humidity environment causes a problem that the Al electrodes corrode and melt and a withstand voltage cannot be maintained, or a leakage current increases.

PTL 1 is an example of a technique for providing a field plate of the termination region using a material other than Al. PTL 1 discloses that a field plate (115) is provided by polysilicon having a higher resistance than Al. The object of PTL 1 is not to improve a high temperature and high humidity bias resistance, which is an object of the present invention, but to prevent migration of Al due to a current flowing in the field plate.

Further, PTL 1 discloses a structure (FIG. 1) in which a polysilicon field plate (115) is directly connected to a field-limiting layer (114) in order to electrically connect a p-type field-limiting layer (114) and a field plate (115), and a structure (FIGS. 4 and 5) in which a field-limiting layer (114) and a field plate (115) are connected via a contact (402) of an aluminum contact electrode (401) without being directly connected. In addition, PTL 1 discloses a structure (FIG. 7) in which a capacitance is formed by the field plate (115) and the field-limiting layer (114) via a gate oxide film (108).

CITATION LIST

Patent Literature

PTL 1: JP 2003-158258 A

SUMMARY OF INVENTION

Technical Problem

In PTL 1 described above, the present inventor has considered that there are problems regarding the connection structure between the field-limiting layer and the field plate, as described in the following. In a switching device such as an insulated gate bipolar transistor (IGBT), polysilicon is used as a material of a gate electrode. Therefore, a gate oxide film usually exists between polysilicon and Si, and in order to directly connect polysilicon and a field-limiting layer, it is necessary to separately add patterning including photolithography and an etching process in order to process a field oxide film including the gate oxide film.

Further, in the case of a structure in which the field-limiting layer and the polysilicon field plate are connected via the aluminum contact electrode, the aluminum contact electrode and the polysilicon make contact with a small part of the side wall or upper portion of the polysilicon as illustrated in FIG. 5 of PTL 1, and thus the contact resistance increases. In PTL 1, it is described that the migration of Al can be further suppressed by increasing the contact resistance. However, in the present invention, it is not necessary to increase a junction resistance between the field-limiting layer and the polysilicon, and the purpose is to reliably make contact, and thus the above connection method is not suitable in the present invention.

In addition, capacitive coupling has high resistance (high impedance) similarly to the above, and thus the above connection method is not suitable in the present invention.

Furthermore, PTL 1 discloses a structure in which only one field-limiting layer is provided, and a case where there is a plurality of the field-limiting layers is not considered. Moreover, an arrangement of aluminum contact electrode in a chip has not been studied.

In view of the above circumstances, an object of the present invention is to provide a semiconductor device that, as compared with a conventional semiconductor device, increases a high temperature and high humidity bias resistance and realizes favorable connection between a field-limiting layer and a field plate, and a power conversion device using the semiconductor device.

Solution to Problem

One aspect of a semiconductor device according to the present invention for solving the above problems includes: a floating field-limiting layer provided in a termination region; and a field plate electrically connected to the field-limiting layer, wherein the field plate is made of polysilicon, the field plate and the field-limiting layer are connected via an Al electrode, and the field-limiting layer and the Al electrode are connected by a contact different from a contact by which the field plate and the Al electrode are connected.

Further, one aspect of a power conversion device of the present invention includes: a pair of DC terminals; AC terminals, a number of the AC terminals being identical with a number of phases of an AC output; switching legs to which two parallel circuits are connected in series, each of the parallel circuits including a switching element and a diode connected in antiparallel to the switching element, the switching legs being connected between the pair of DC terminals, a number of the switching legs being identical with the number of phases of the AC output; and a gate circuit configured to control the switching element, wherein at least one of the switching element and the diode is the semiconductor device as described above.

A more specific configuration of the present invention is described in the claims.

Advantageous Effects of Invention

According to the present invention, it is possible to provide a semiconductor device that, as compared with a conventional semiconductor device, increases a high temperature and high humidity bias resistance and realizes favorable connection between a field-limiting layer and a field plate, and a power conversion device using the semiconductor device.

Problems, configurations, and effects other than those described above will become apparent from the following description of embodiments.

BRIEF DESCRIPTION OF DRAWINGS

FIG. 2 is a partially enlarged view of FIG. 1 and a sectional view thereof.

DESCRIPTION OF EMBODIMENTS

Hereinafter, embodiments of the present invention will be described in detail with reference to the drawings.

First Embodiment

Figure 1:
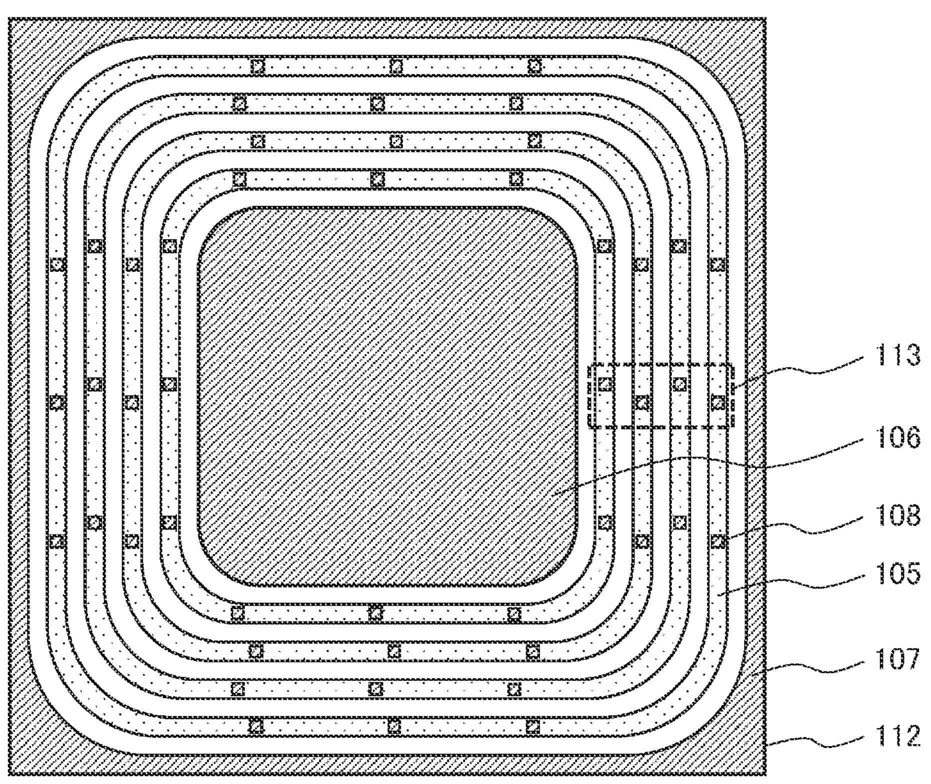
FIG. 1 is a top view of a semiconductor device of the present invention.
Figure 2:
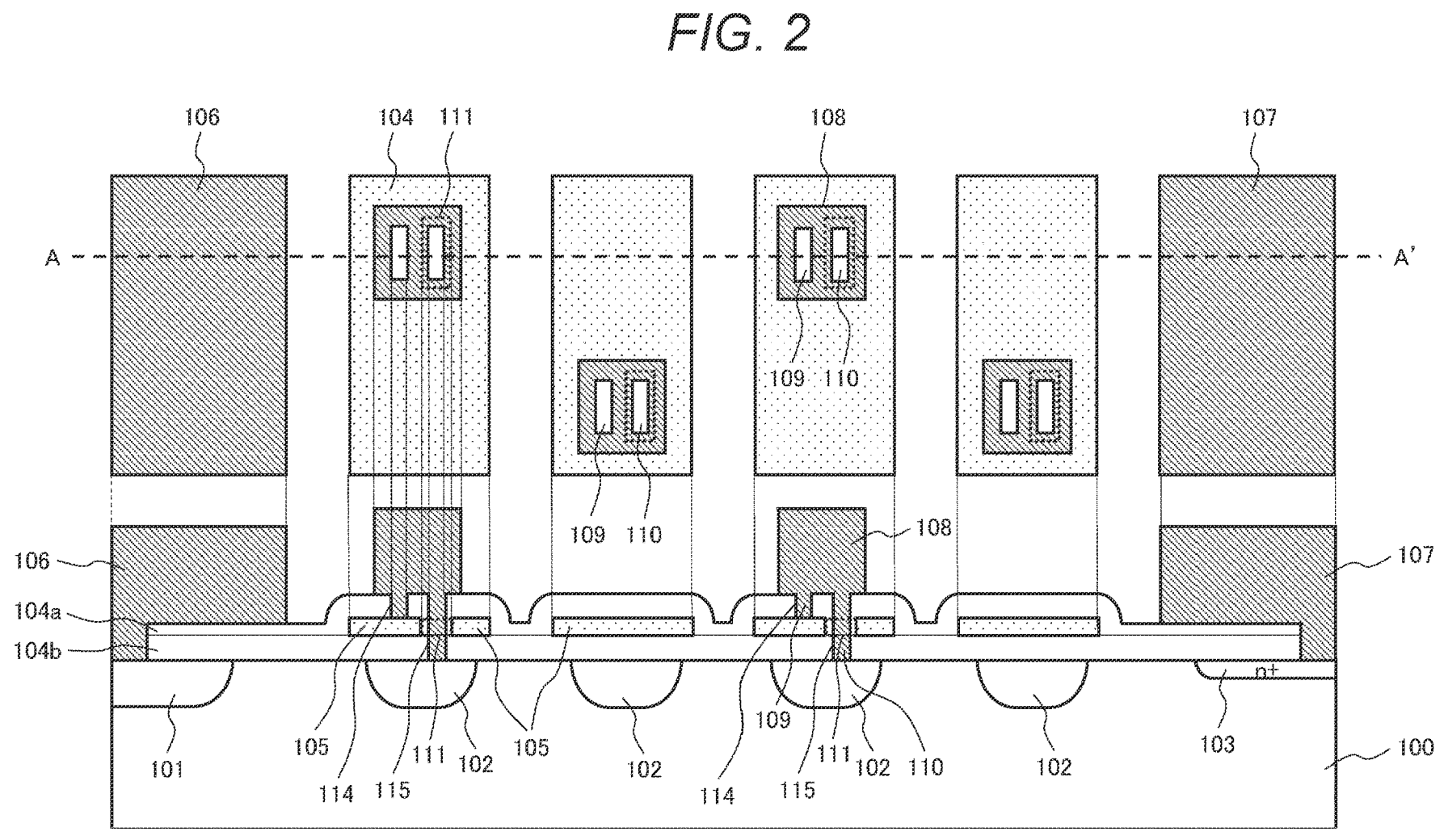

FIG. 1 is a top view of a semiconductor device of the present invention, and FIG. 2 is a partially enlarged view of FIG. 1 and a sectional view thereof. An upper view of FIG. 2 is an enlarged view of the Al electrode group 113 of FIG. 1, and a lower view of FIG. 2 is a sectional view taken along line A-A' of the upper view of FIG. 2. As illustrated in FIG. 1, a semiconductor device 112 of the present embodiment includes an anode electrode 106 provided in an active region at the center, and polysilicon field plates 105 and Al electrodes 108 in a termination region provided around the active region. A guard ring 107 is provided around the termination region. In the present embodiment, an embodiment applied to a diode is described, but the present invention is not limited thereto, and may be applied to a switching element such as an IGBT or a MOSFET.

As illustrated in FIG. 2, in the termination region, a p-type well layer 101 connected to the anode electrode 106, a plurality of floating p-type field-limiting layers 102, and an n+ channel stopper layer 103 disposed at a chip end are provided on a surface of an n-layer substrate 100, in order to maintain a withstand voltage. The p-type well layer 101 extends from the active region and is connected to the anode electrode 106. The channel stopper layer 103 is connected to the guard ring electrode 107. The conductivity type (n, p) may be reversed. Although FIG. 2 shows a case where there are four field-limiting layers 102, the number of the field-limiting layers 102 may be at least one, and the number is not limited.

The field-limiting layers 102 in the termination region are electrically connected to the polysilicon field plates 105 via the Al electrodes 108. Here, in order to secure a high temperature and high humidity bias resistance, the Al electrodes 108 are provided only in a part of the polysilicon field plates 105. In the present embodiment, a contact 110 for connecting the Al electrode 108 and the field-limiting layer 102, and a contact 109 for connecting the Al electrode 108 and the polysilicon field plate 105 are separately provided. That is, a contact hole 114 for connecting the Al electrode 108 and the field plate 105 is provided in an interlayer film 104*a* and constitutes the contact 109, and a contact hole 115 for connecting the Al electrode 108 and the field-limiting layer is provided in the interlayer film 104*a* and an interlayer film 104*b* and constitutes the contact 110. In FIG. 2, one Al electrode 108 and one polysilicon field plate 105 have one contact, but the number of contacts may be at least one, and more than one contact may be provided. Similarly, the number of contacts between the Al electrode 108 and one field-limiting layer 102 is one, but the number of contacts may be at least one, and more than one contact may be provided.

In order to reliably connect the Al electrode 108 and the field-limiting layer 102 layer, a polysilicon extraction region 111 is provided around the contact 110 so as not to provide the polysilicon field plate 105.

In addition, as illustrated in the upper view of FIG. 2, the Al electrode groups are alternately arranged such that the adjacent Al electrodes 108 are not arranged on a straight line. With such a configuration, a large distance between adjacent Al electrodes can be secured, and the Al electrode 108 can be prevented from corroding and melting due to a potential difference.

According to the present structure, corrosion and melting of the Al electrode can be avoided by providing a polysilicon field plate instead of the field plate of the Al electrode in order to improve the high temperature and high humidity bias resistance. In addition, the Al electrode is used to electrically connect the field-limiting layer and the polysilicon field plate, and the field-limiting layer and the Al electrode are connected by a contact different from a contact by which the field plate and the Al electrode are connected. Thus, a contact resistance can be suppressed by reliable contact other than the side wall of the polysilicon field plate, and good connection can be realized. Furthermore, by reducing the area of the Al electrodes as much as possible and alternately arranging the Al electrode regions, the electric field applied between the Al electrodes can be relaxed, and the high temperature and high humidity bias resistance can be secured.

Second Embodiment

Next, a power conversion device using the above-described semiconductor device of the present invention will be described.

Figure 3:
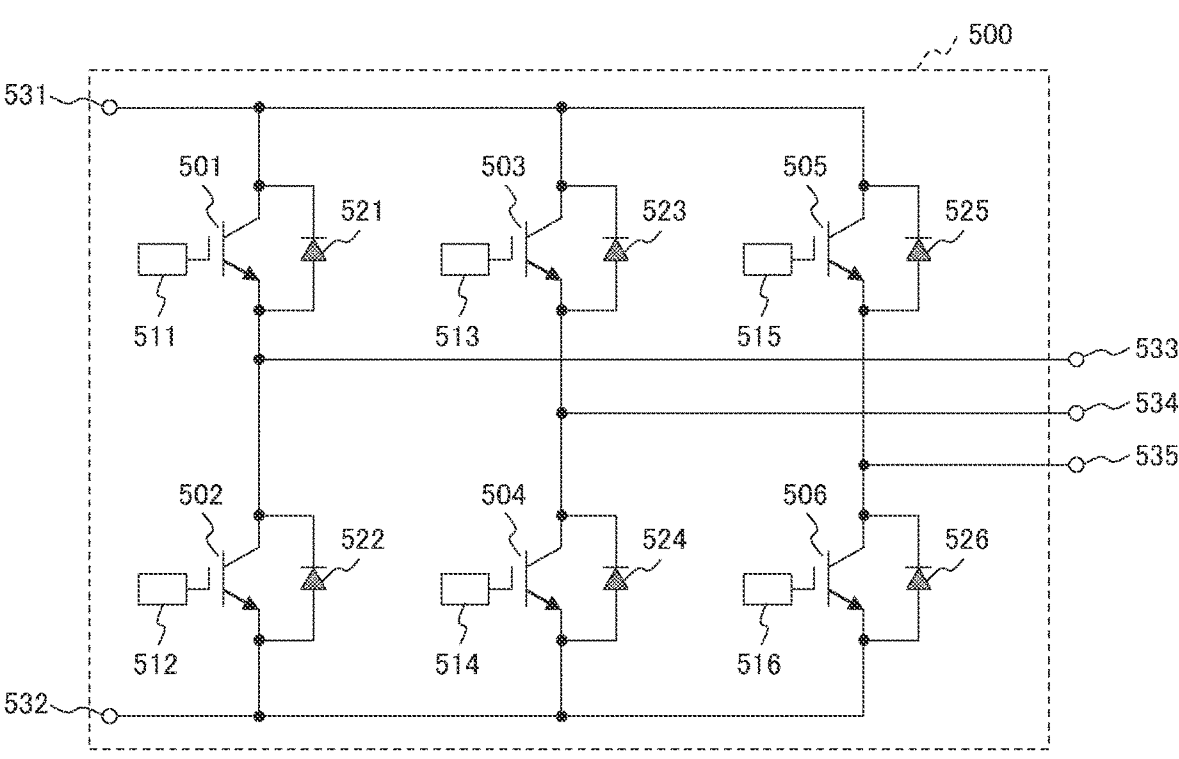
FIG. 3 is a circuit diagram showing a schematic configuration of a power conversion device of the present invention.

FIG. 3 is a circuit diagram illustrating a schematic configuration of a power conversion device of the present invention. FIG. 3 illustrates an example of a circuit configuration of a power conversion device 500 of the present embodiment and a connection relationship between a DC power supply and a three-phase AC motor (AC load).

In the power conversion device 500 of the present embodiment, the above-described semiconductor device of the present invention is used as any or all of the power switching elements 501-506 and the diodes 521-526. The power switching elements 501-506 are IGBTs, for example, and the elements 521-526 are diodes.

As illustrated in FIG. 3, the power conversion device 500 of the present embodiment includes a P terminal 531 and an N terminal 532 which are a pair of DC terminals, and a U terminal 533, a V terminal 534, and a W terminal 535 which are AC terminals of a number identical to the number of phases of an AC output.

The power conversion device 500 also includes a switching leg configured by series connection of the pair of power switching elements 501 and 502 and having the U terminal 533 connected to a series connection point thereof as an output. The power conversion device 500 also includes a switching leg configured by series connection of the power switching elements 503 and 504 having the same configuration, and having the V terminal 534 connected to a series connection point thereof as an output is provided. The power conversion device 500 also includes a switching leg configured by series connection of the power switching elements 505 and 506 having the same configuration, and having the W terminal 535 connected to a series connection point thereof as an output is provided.

The switching legs for three phases including the power switching elements 501-506 are connected between the DC terminals of the P terminal 531 and the N terminal 532, and DC power is supplied from a DC power supply that is not illustrated. The U terminal 533, the V terminal 534, and the W terminal 535, which are the three-phase AC terminals of the power conversion device 500, are connected to the three-phase AC motor that is not illustrated as a three-phase AC power supply.

The power switching element 501 and the diode 521 connected in antiparallel to the power switching element 501 are connected to constitute a parallel circuit. Similarly, the power switching element 502 and the diode 522, the power switching element 503 and the diode 523, the power switching element 504 and the diode 524, the power switching element 505 and the diode 525, and the power switching element 506 and the diode 526 are connected to constitute a parallel circuit, respectively. The parallel circuit including the power switching element 501 and the parallel circuit including the power switching element 502 are connected in series. Similarly, the parallel circuit including the power switching element 503 and the parallel circuit including the power switching element 504 are connected in series, and the parallel circuit including the power switching element 505 and the parallel circuit including the power switching element 506 are connected in series.

Gate circuits 511-516 are respectively connected to input terminals of gates of the power switching elements 501-506 constituted by IGBTs, and the power switching elements 501-506 are respectively controlled by the gate circuits 511-516. The gate circuits 511-516 are integrally controlled by an integrated control circuit that is not illustrated.

The power switching elements 501-506 are integrally and appropriately controlled by the gate circuits 511-516, and DC power of the DC power supply is converted into three-phase AC power and is output through the U terminal 533, the V terminal 534, and the W terminal 535.

By applying the semiconductor device of the present invention described above to the power conversion device 500, it is possible to provide a power conversion device having an improved high temperature and high humidity bias resistance as compared with the related art, and that realizes favorable connection between the field-limiting layer and the field plate.

As described above, according to the present invention, it has been shown that it is possible to provide a semiconductor device that, as compared with a conventional semiconductor device, increases a high temperature and high humidity bias resistance and realizes favorable connection between a field-limiting layer and a field plate, and a power conversion device using the semiconductor device.

Note that the present invention is not limited to the above-described embodiments, and includes various modifications. For example, the above-described embodiments have been described in detail in order to describe the present invention in an easy-to-understand manner, and are not necessarily intended to limit to those having all of the described configurations. Further, a part of one configuration of a certain embodiment can be replaced with a configuration of a different embodiment, and a configuration of one embodiment can be added to a configuration of a different embodiment. In addition, it is possible to add, delete, and replace other configurations for a part of the configuration of each embodiment.

Reference Signs List

100 n-layer
101 p-type well layer (main junction)
102 field-limiting layer (floating layer)
103 channel stopper layer
104*a*, 104*b* interlayer film
105 polysilicon field plate
106 anode electrode
107 guard ring electrode
108 Al electrode
109 contact (connecting Al electrode and polysilicon field plate)
110 contact (connecting Al electrode and field-limiting layer)
111 polysilicon extraction region
112 semiconductor device
113 Al electrode group
500 power conversion device
501 to 506 power switching element
511 to 516 gate circuit
521 to 526 diode
531 P terminal
532 N terminal
533 U terminal
534 V terminal
535 W terminal

The invention claimed is:

1. A semiconductor device comprising:

a floating field-limiting layer provided in a termination region; and a field plate electrically connected to the field-limiting layer, wherein the field plate is made of polysilicon, the field plate and the field-limiting layer are connected via an aluminum (Al) electrode, a plurality of the field-limiting layers, a plurality of the field plates, and a plurality of the Al electrodes are disposed, the plurality of the Al electrodes constitutes an electrode group in which adjacent Al electrodes are arranged alternately to prevent the Al electrodes from being aligned on a straight line when an upper surface of the semiconductor device is viewed, for each Al electrode of the plurality of the Al electrodes, the field-limiting layer and the Al electrode are connected by a contact different from a contact by which the field plate and the Al electrode are connected, for each Al electrode of the plurality of the Al electrodes, a number of the contact by which the field-limiting layer and the Al electrode are connected is only one, and a number of the contact by which the field plate and the Al electrode are connected is only one, and for each Al electrode of the plurality of the Al electrodes, the contact by which the field-limiting layer and the Al electrode are connected and the contact by which the field plate and the Al electrode are connected are aligned in a direction perpendicular to a direction in which the field plate extends when the upper surface of the semiconductor device is viewed.

2. The semiconductor device according to claim 1, wherein a plurality of the electrode groups of the plurality of the Al electrodes alternately arranged is disposed.

3. A power conversion device comprising:

a pair of DC terminals;

AC terminals, a number of the AC terminals being identical with a number of phases of an AC output;

switching legs to which two parallel circuits are connected in series, each of the parallel circuits including a switching element and a diode connected in antiparallel to the switching element, the switching legs being connected between the pair of DC terminals, a number of the switching legs being identical with the number of phases of the AC output; and a gate circuit configured to control the switching element, wherein at least one of the switching element or the diode is the semiconductor device according to claim 1.

* * * * *